(12) United States Patent
Berre et al.

(10) Patent No.: US 11,587,826 B2
(45) Date of Patent: Feb. 21, 2023

(54) METHOD FOR SUSPENDING A THIN LAYER ON A CAVITY WITH A STIFFENING EFFECT OBTAINED BY PRESSURIZING THE CAVITY BY IMPLANTED SPECIES

(71) Applicant: COMMISSARIAT A L'ENERGIE ATOMIQUE ET AUX ENERGIES ALTERNATIVES, Paris (FR)

(72) Inventors: Guillaume Berre, Grenoble (FR); Frédéric Mazen, Grenoble (FR); Thierry Salvetat, Grenoble (FR); François Rieutord, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 17/193,155

(22) Filed: Mar. 5, 2021

(65) Prior Publication Data
US 2021/0287933 A1 Sep. 16, 2021

(30) Foreign Application Priority Data
Mar. 10, 2020 (FR) ..................................... 20 02343

(51) Int. Cl.
*H01L 21/762* (2006.01)
*B81B 7/00* (2006.01)
(Continued)

(52) U.S. Cl.
CPC .... *H01L 21/76254* (2013.01); *H01L 21/3221* (2013.01)

(58) Field of Classification Search
CPC ......... H01L 21/76254; H01L 21/76259; H01L 21/3221
See application file for complete search history.

(56) References Cited

U.S. PATENT DOCUMENTS 6,495,429 B1 * 12/2002 Adamcek .......... H01L 21/76243
438/480
6,540,827 B1 * 4/2003 Levy ....................... C30B 29/28
438/458
(Continued)

FOREIGN PATENT DOCUMENTS

EP 3 401 273 A1 11/2018
FR 3 074 358 A1 5/2019
(Continued)

OTHER PUBLICATIONS

French Preliminary Search Report dated Oct. 20, 2020 in French Application 20 02343 filed Mar. 10, 2020 (with English Translation of Categories of Cited Document), 2 pages.
(Continued)

*Primary Examiner* — Mohsen Ahmadi
(74) *Attorney, Agent, or Firm* — Oblon, McClelland, Maier & Neustadt, L.L.P.

(57) ABSTRACT

A method for transferring a semiconductor layer from a donor substrate to a receiver substrate having an open cavity includes forming an embrittlement plane in the donor substrate, making, by bringing the donor substrate and the receiver substrate into contact, a packaging in which the cavity is buried, and separating the packaging by fracturing along the embrittlement plane. The separating causes a transfer of the semiconductor layer to the receiver substrate and a sealing of the cavity by the semiconductor layer. The method also includes, prior to making the packaging, implanting diffusing species into the donor substrate or into the receiver substrate and, subsequently to making the packaging and prior to separating the packaging, diffusing the species into the cavity.

20 Claims, 3 Drawing Sheets

(51) Int. Cl.
  *B81C 1/00*   (2006.01)
  *H01L 21/322*   (2006.01)

(56) References Cited

U.S. PATENT DOCUMENTS

| | | | | |
|---|---|---|---|---|
| 7,232,488 | B2* | 6/2007 | Akatsu | C30B 25/02 |
| | | | | 117/930 |
| 7,442,623 | B2* | 10/2008 | Endo | H01L 21/76256 |
| | | | | 438/455 |
| 2003/0036247 | A1* | 2/2003 | Eriksen | H01L 21/76254 |
| | | | | 438/455 |
| 2003/0077885 | A1* | 4/2003 | Aspar | H01L 21/76254 |
| | | | | 438/517 |
| 2004/0235264 | A1* | 11/2004 | Forbes | H01L 21/324 |
| | | | | 257/E21.411 |
| 2011/0201176 | A1* | 8/2011 | Ramappa | H01L 21/76254 |
| | | | | 257/E21.568 |
| 2012/0097868 | A1* | 4/2012 | Dickerson | H01L 21/26506 |
| | | | | 250/492.3 |
| 2017/0243781 | A1* | 8/2017 | Peidous | H01L 21/76254 |
| 2017/0345709 | A1* | 11/2017 | Malaquin | H01L 21/76254 |
| 2018/0346321 | A1 | 12/2018 | Takubo et al. | |
| 2019/0202688 | A1* | 7/2019 | Benaissa | B81C 1/00507 |
| 2019/0326160 | A1* | 10/2019 | Li | H01L 21/76254 |
| 2020/0152505 | A1* | 5/2020 | Ishizuka | H01L 21/76254 |
| 2022/0298007 | A1* | 9/2022 | Salvetat | B81B 7/04 |

FOREIGN PATENT DOCUMENTS

| | | | | |
|---|---|---|---|---|
| WO | WO 2006/032948 | A1 | 3/2006 | |
| WO | WO-2010015470 | A1 * | 2/2010 | ....... H01L 21/76254 |
| WO | WO 2012/145485 | A2 | 10/2012 | |
| WO | WO 2015/119564 | A1 | 8/2015 | |

OTHER PUBLICATIONS

Yun, C-H. et al., "Fabrication of Silicon and Oxide Membranes Over Cavities Using Ion-Cut Layer Transfer," Journal of Microelectromechanical Systems, vol. 9, Vo. 4, Dec. 2000, 4 pages.
U.S. Appl. No. 16/732,950, filed Jan. 2, 2020, US 2020/0219719 A1, Pablo Acosta Alba et al.
U.S. Appl. No. 16/733,006, filed Jan. 2, 2020, US 2020/0219762 A1, Shay Reboh et al.

* cited by examiner

METHOD FOR SUSPENDING A THIN LAYER ON A CAVITY WITH A STIFFENING EFFECT OBTAINED BY PRESSURIZING THE CAVITY BY IMPLANTED SPECIES

TECHNICAL FIELD

The field of the invention is that of designing substrates containing buried cavities. The invention more particularly relates to the transfer of a thin layer to suspend it on an initially open cavity and thus seal the cavity.

PRIOR ART

Manufacturing buried cavities involves suspending a thin layer (from a few nanometres to a few microns thick) on cavities having varying sizes and geometries, from a few microns for microelectromechanical resonator type applications to a few hundred microns for microelectronic packaging type applications.

The most common method for making this suspension is thinning a silicon or silicon-on-insulator (SOI) substrate. Other methods use technologies such as bonding, drilling a substrate and etching the substrate to machine the cavities. These techniques, although mastered, are problematic in terms of cost (complete consumption of an Si substrate or worse of an SOI substrate), time (long thinning method) and thin layer thickness.

The Smart Cut™ technology is a technique that has been widely developed for about two decades to enable the transfer of thin layers of semiconductor materials. According to this technique, ionic species such as hydrogen and/or helium are implanted into a donor substrate to form an embrittlement plane therein. The donor substrate is then brought into contact with a support substrate, for example by direct bonding. This technique then involves the development of defects generated at the embrittlement plane. This development implies an energy input, generally carried out by means of a heat treatment of a few hundred degrees, typically 500° C., for a few tens of minutes. This results in forming a confined layer of cavities and microcracks within which a fracture will initiate and propagate. This fracture separates the donor substrate along the embrittlement plane and a thin layer of the donor substrate is thus transferred to the support substrate.

However, this method cannot be directly used to make suspension of a thin layer on a cavity of any size. The publication by C-H Yun and N. W. Cheung, "Fabrication of Silicon and Oxide Membranes Over Cavities Using Ion-Cut Layer Transfer", Journal of Microelectromechanical Systems, vol. 9, no. 4, December 2000, actually shows that a membrane having a given thickness can be successfully transferred only to cavities having a size below a limit size. This is related to the fact that there is no stiffening effect in the cavity. A blister can therefore develop, leading to deformation of the membrane, which can break (exfoliation) resulting in local failure of the transfer.

Due to this exfoliation phenomenon, the transfer to cavities by Smart Cut' is therefore limited in practice to cavities of a few microns or even tens of microns, depending on various parameters and in particular the implantation depth.

DISCLOSURE OF THE INVENTION

There is a need to provide a technique for sealing a cavity by means of transferring a thin layer to the cavity by Smart Cut™, a technique that would be applicable to sealing of cavities with larger sizes.

One embodiment provides a method for transferring a semiconductor layer from a donor substrate to a receiver substrate having an open cavity, comprising the steps of forming an embrittlement plane in the donor substrate and making, by bringing the donor substrate and the receiver substrate into contact, a packaging in which said cavity is buried. The method comprises, prior to making the packaging, a step of implanting gaseous species into the donor substrate or into the receiver substrate and, subsequently to making the packaging, a step of diffusing said species into the cavity.

Another embodiment provides a method for transferring a semiconductor layer from a donor substrate to a receiver substrate having an open cavity, comprising the steps of:
  forming an embrittlement plane in the donor substrate;
  making, by bringing the donor substrate and the receiver substrate into contact, a packaging in which said cavity is buried;
  separating the packaging by fracturing along the embrittlement plane, said separating causing a transfer of the semiconductor layer to the receiver substrate and a sealing of the cavity by the semiconductor layer; and
  further comprising, prior to making the packaging, a step of implanting diffusing species into the donor substrate or into the receiver substrate and, subsequently to making the packaging and prior to separating the packaging, a step of diffusing said species into the cavity.

Some preferred but not limiting aspects of this method are the following:
  the step of diffusing said species into the cavity may comprise annealing the packaging;
  said annealing may be continued until the packaging is separated by fracturing along the embrittlement plane;
  said species may be implanted into the receiver substrate at a depth lower than the depth of the embrittlement plane in the donor substrate;
  the diffusing species may not be implanted through the bottom of the cavity; and
  the diffusing species may be implanted into the donor substrate at a depth lower than the depth of the embrittlement plane.

BRIEF DESCRIPTION OF THE DRAWINGS

Further aspects, purposes, advantages and characteristics of the invention will better appear upon reading the following detailed description of the preferred embodiments thereof, given by way of non-limiting example and with reference to the appended drawings in which.

DETAILED DISCLOSURE OF PARTICULAR EMBODIMENTS

During fracture annealing of the Smart Cut™ method, the species previously introduced by ion implantation to form the embrittlement plane will react and form defects at a certain depth in the donor substrate. These defects are pressurised and their variation in time depends on the rigidity of the system (stiffening effect).

Figure 1:
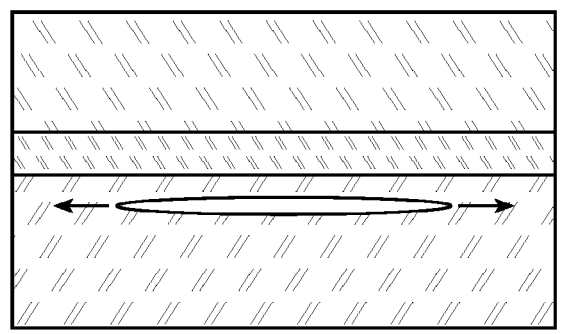
FIG. 1 is a diagram illustrating microcrack-type defects developing in the presence of a stiffener.

As shown in FIG. 1, in the presence of a stiffening effect, brought by a substrate bonded to the donor substrate or by a thick deposit thereon, the defects develop as microcracks which propagate preferentially laterally and can reach sizes of a few hundred microns.

Figure 2:
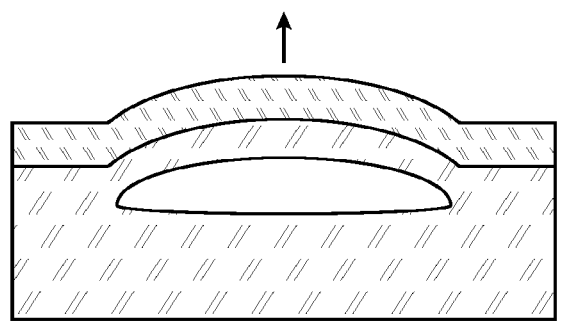
FIG. 2 is a diagram illustrating blister-type defects developing in the absence of a stiffener.

As shown in FIG. 2, in the absence of a stiffening effect, with the surface of the substrate being left free, the defects develop as blisters which propagate horizontally and vertically, their growth being limited by the exfoliation phenomenon corresponding to their decapsulation.

The maximum size of the blisters, and therefore the size of the exfoliations, is critical in the cavity transfer method because this mode of growth is present in the cavities during fracture annealing. Thus, if there is exfoliation before the fracture passes therethrough, the cavity will be systematically drilled.

Figure 3:
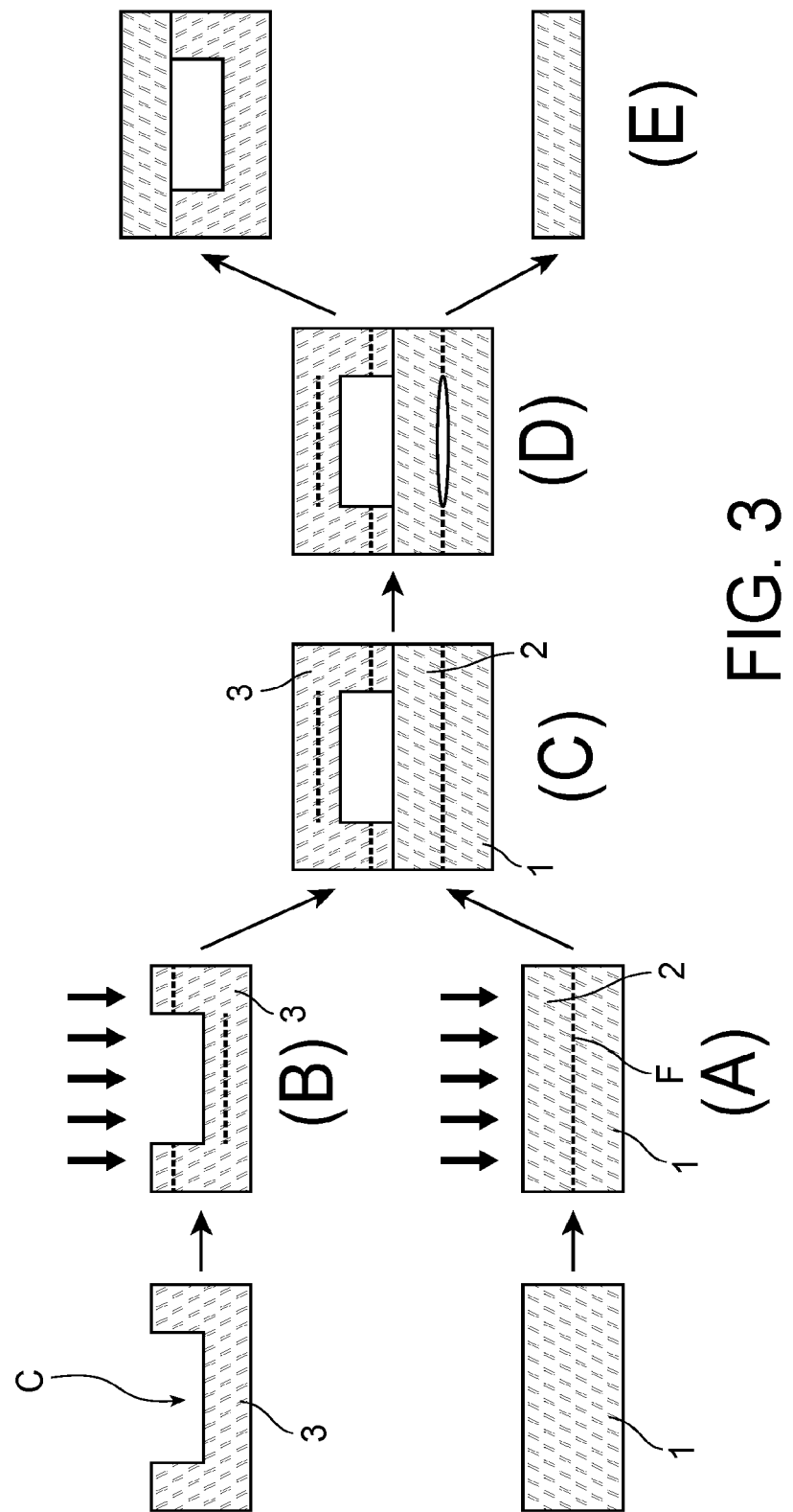
FIG. 3 is a diagram illustrating the different steps of a method according to one embodiment.

With reference to FIG. 3, it is disclosed a method for transferring a semiconductor layer 2 from a donor substrate 1 to a receiver substrate 3. The receiver substrate includes at least one open cavity C, for example resulting from etching, and transferring the semiconductor layer is intended to seal this cavity. This method finds application in manufacturing any type of device based on the use of a suspended membrane, such as for example capacitive micromachined ultrasonic transducers (cMUTs).

The receiver substrate may have a plurality of open cavities, these cavities may potentially have different sizes and/or geometries. The thin layer transferred then covers all or part of the cavities of the receiver substrate.

The donor substrate may comprise a multilayer structure, for example a multi-material multilayer structure (for example a silicon oxide or nitride deposit, thin metal deposits or other functional deposits). These deposits may be made prior to ion implantation (while remaining compatible with it) or after ion implantation (but in this case they should not use thermal budgets that may cause defects to mature at the implanted zone; they are typically made at a temperature lower than 400° C., advantageously lower than or equal to 350° C.).

The method according to the invention comprises a step (A) of forming an embrittlement plane F in the thickness of the donor substrate 1 by means of implanting ionic species, for example hydrogen and/or helium. This embrittlement plane delimits a surface portion of the donor substrate which will form the thin layer to be transferred 2 from a solid part of the donor substrate.

The method comprises a step (B) of implanting gaseous species into the receiver substrate, named diffusing species because they are able to diffuse into the material of the receiver substrate especially under the effect of a heat treatment.

This implantation (B) is preferably of low depth. The implantation depth of the diffusing species in the receiver substrate is preferably lower than the depth of the embrittlement plane F formed in the donor substrate. The implantation depth of the diffusing species may thus be between 5 nm and 200 nm. Especially, the implantation depth of the diffusing species is preferably lower than the depth of the cavity. These depth criteria enable the diffusion of the diffusing species in the cavity to be maximised during subsequent annealing before the defects in the embrittlement plane of the donor substrate have matured.

In a favoured embodiment, helium implantation is carried out during this step (B).

Implanting the diffusing species may be carried out through a mask to limit implantation to the zones of the receiver substrate without cavities and thus not implant said diffusing species through the bottom of the cavity or cavities.

This implantation may additionally be carried out using the plasma immersion implantation technique in order to obtain a good distribution of the implanted species, especially in proximity to the surface (between 5 nm and 200 nm deep).

In an alternative embodiment, the diffusing species are implanted not in the receiver substrate, but in the donor substrate. The implantation depth of the diffusing species is lower than the implantation depth of the ionic species resulting in forming the embrittlement plane.

The method then comprises a step of making (C), by bringing the donor substrate 1 and the receiver substrate 3 in contact, a packaging in which said cavity is buried. Bringing the substrates 1, 3 into contact is thus carried out so that the thin layer 2 seals the cavity. The packaging of the donor substrate 1 and the support substrate 3 may be made by means of a layer previously deposited on one or both of the substrates 1, 3, such as for example a dielectric or metal layer or a stressed layer.

The method comprises a step (D) of diffusing the diffusing species into the cavity. This diffusion step may include annealing the packaging (the temperature and duration of which may be those of the fracture annealing). The gaseous species diffused into the cavity pressurise it. This pressure exerts a stiffening effect in the cavity and prevents or limits the development of blisters at the embrittlement plane directly above the cavity. Said annealing may be continued until the packaging (E) is separated by fracturing along the embrittlement plane.

Figure 4:
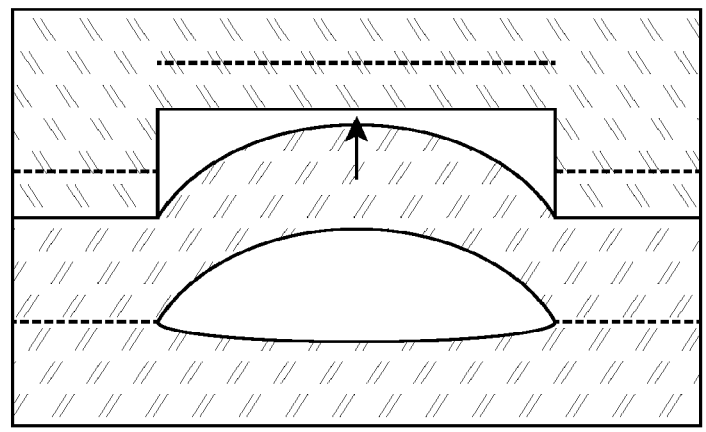
FIG. 4 is a diagram illustrating the phenomenon of vertical growth of defects in the cavity in the absence of implementation of the invention.
Figure 5:
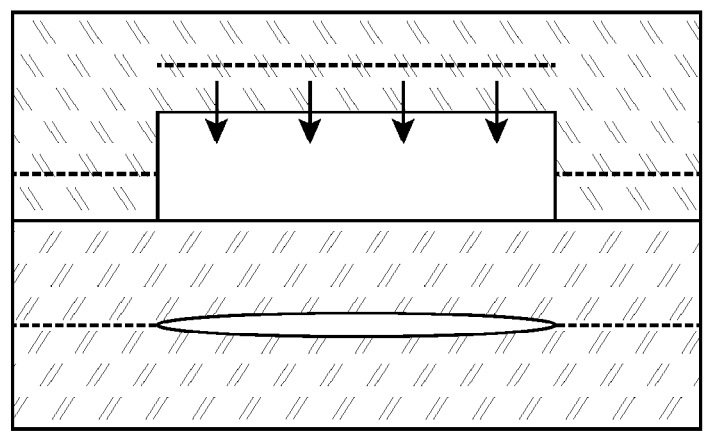
FIG. 5 is a diagram illustrating the phenomenon of lateral growth of defects by counter-pressure in the cavity due to the implementation of one embodiment.

Thus, this method implements a counter-pressure in the cavity in order to force blister-type defects to propagate laterally. Under the effect of this counter-pressure, conditions of exfoliation are modified and defect growth gets closer to lateral growth as for microcracks. A diagram illustrating the phenomenon of vertical growth of defects in the cavity in the absence of implementation of the invention has been shown in FIG. 4. FIG. 5 in turn illustrates the phenomenon of lateral growth of defects by counter-pressure in the cavity due to the implementation of the invention.

Thus, the transfer on cavity is no longer limited by the exfoliation phenomenon and, with the thickness of the transferred film being set, it is possible to perform sealing of cavities having much larger sizes than in the state of the art.

The description below is directed to a method for quantifying the necessary dose of diffusing species to be implanted in order to obtain the necessary counter-pressure. This method takes the example of forming the embrittlement plane by implanting hydrogen into the donor substrate and implanting helium as a diffusing species into the receiver substrate.

In order to quantify the necessary helium dose, the amount of hydrogen present in the blisters before the fracture passes therethrough has to be quantified. To do this, the maximum size of the blisters that will be present should be described according to the dimensions of the cavity. Let us take as an example a target cavity in the form of a cylinder with a height a and a diameter L at the base. The blister which will develop before fracturing will therefore have a maximum radius R of L/2.

In order to determine the helium dose X (noted $D_{tot2}$) to be implanted, the pressure in the blister should be compared with the pressure in the cavity. To determine the pressure in the blister, the geometry of a blister is expressed according to the theory of elasticity of plates and blisters developed by Timoshenko.

The maximum deflection of the blister is given by $$h_{Max} = \frac{3}{16} * \frac{1-v^2}{Ee^3} P_1 R^4$$

where E is the Young's modulus of the material making up the transferred thin layer, $v$ is its Poisson's ratio, $P_1$ is the pressure in the blister, R is the radius of the blister and e is the thickness of the transferred thin layer. The volume of the blister is then expressed according to $$V_{blister} = \frac{\pi}{3} h_{Max} R^2.$$

Assuming that a fraction $\alpha$ of the hydrogen dose (noted $D_{tot1}$) implanted in the donor substrate is found in the blister, there is, in the blister, a hydrogen dose $D_1 = \alpha D_{tot1}$ and an amount of hydrogen $$N_1 = \alpha D_{tot_1} \frac{\pi}{4} L^2.$$

By applying the ideal gas law, a formula is obtained for pressure $P_1$ in the blister:

$$P_1 = \frac{N_1 k_B T}{V_{blister}}$$

where $k_B$ is Boltzmann's constant, that is $$P_1^2 = \frac{\alpha D_{tot_1} k_B T}{\frac{1}{16} * \frac{1-v^2}{Ee^3} \left(\frac{L}{2}\right)^4}.$$

To determine the helium dose $D_{tot_2}$ to be implanted into the receiver substrate, the geometry of the cavity should be expressed:

$$V_{cavity} = a \frac{\pi}{4} L^2.$$

Assuming that the entire helium dose implanted will pressurise the cavity due to the diffusion of helium into silicon, an amount of helium in the cavity $$N_2 = D_{tot_2} \frac{\pi}{4} L^2 \text{ is}$$

obtained. By applying the ideal gas law, a formula is obtained for pressure $P_2$ in the cavity:

$$P_2 = \frac{D_{tot_2} k_B T}{a}.$$

In order to obtain a pressure in the cavities which is sufficient to promote lateral propagation of blisters, it is necessary to have at least $P_1 = P_2$. By equalising the pressure formulas, it is obtained:

$$\frac{\alpha D_{tot_1} k_B T}{\frac{1}{16} * \frac{1-v^2}{Ee^3} \left(\frac{L}{2}\right)^4} = \left(\frac{D_{tot_2} k_B T}{a}\right)^2$$

From this, a relationship is deduced between the helium dose to be implanted as a function of the depth of the cavity (a), the diameter of the cavity (L), the material properties of the thin layer (E,$v$) and the hydrogen dose $$(D_{tot_1}) : D_{tot_2} = \frac{16a}{L^2} * \sqrt{\frac{Ee^3}{(1-v^2)} * \frac{1}{k_B T} * \alpha D_{tot_1}}.$$

In order to illustrate these formulas with a practical case, suspending a thin film of 1.4 μm silicon is considered using hydrogen implantation into the receiver substrate with a dose $D_{tot1} = 6*10^{16}$ at/cm$^2$ and an energy of 160 keV. Taking the parameters E=130 GPa, $v$=0.28, L=40 μm, a=350 nm, T=500° C., α=30%, Dtot1=2.8*10$^{16}$ at/cm$^2$ is obtained as the helium dose to be implanted.

The invention claimed is:

1. A method for transferring a semiconductor layer from a donor substrate to a receiver substrate having an open cavity, comprising:
   forming an embrittlement plane in the donor substrate;
   making, by bringing the donor substrate and the receiver substrate into contact, a packaging in which said cavity is buried;
   separating the packaging by fracturing along the embrittlement plane, said separating causing a transfer of the semiconductor layer to the receiver substrate and a sealing of the cavity by the semiconductor layer; and
   prior to making the packaging, implanting diffusing species into the donor substrate or into the receiver substrate and, subsequently to making the packaging and prior to separating the packaging, a step of diffusing said species into the cavity.

2. The method according to claim 1, wherein the step of diffusing said species into the cavity comprises annealing the packaging.

3. The method according to claim 2, wherein said annealing is continued until the separating of the packaging by fracturing along the embrittlement plane.

4. The method according to claim 1, wherein the diffusing species are implanted into the receiver substrate at a depth lower than the depth of the embrittlement plane in the donor substrate.

5. The method according to claim 4, wherein the diffusing species are not implanted through a bottom of the cavity.

6. The method according to claim 1, wherein the diffusing species are implanted into the donor substrate at a depth lower than the depth of the embrittlement plane.

7. The method according to claim 1, comprising:
   implanting a first diffusing species into the donor substrate to form the embrittlement plane;

implanting a second diffusing species into the receiver substrate; and
diffusing the second diffusing species into the cavity.

8. The method according to claim 1, comprising implanting a first diffusing species into the donor substrate and implanting a second diffusing species into the receiver substrate different from the first species.

9. The method according to claim 8, comprising:
determining a dose of the second diffusing species implanted in the receiver substrate based upon a depth of the cavity, a diameter of the cavity, material properties of the semiconductor layer, and a dose of the first diffusing species implanted into the donor substrate.

10. The method according to claim 8, comprising:
implanting hydrogen into the donor substrate, and
implanting helium into the receiver substrate.

11. The method according to claim 10, comprising:
determining a dose of helium $D_{tot_2}$ based upon:

$$D_{tot_2} = \frac{16a}{L^2} * \sqrt{\frac{Ee^3}{(1-v^2)} * \frac{1}{k_B T} * \alpha D_{tot_1}}$$

where:
a is a depth of the cavity,
L is a diameter of the cavity,
E is a Young's modulus of a material of the semiconductor layer,
e is a thickness of the semiconductor layer,
v is a Poisson's ratio of the material of the semiconductor layer,
$k_B$ is Boltzmann's constant
T is a temperature at which the separating is conducted,
$D_{tot_1}$ is a dose of implanted hydrogen, and
α is a fraction of the dose of implanted hydrogen found in a blister formed in the donor substrate during the separating.

12. The method according to claim 1, comprising implanting the species into the receiver substrate to a depth lower than the depth of the cavity.

13. A method for transferring a layer from a donor substrate to a receiver substrate having an open cavity, comprising:
forming an embrittlement plane in the donor substrate;
implanting diffusing species into the receiver substrate;
after the implanting, forming, by bringing the donor substrate and the receiver substrate into contact, a packaging in which the cavity is buried;
separating the packaging by fracturing along the embrittlement plane, the separating causing a transfer of the layer to the receiver substrate and a sealing of the cavity by the layer; and
subsequent to forming the packaging, diffusing the species into the cavity.

14. The method according to claim 13, wherein the diffusing species are implanted into the receiver substrate at a depth lower than the depth of the embrittlement plane in the donor substrate.

15. The method according to claim 13, comprising implanting a first diffusing species into the donor substrate and implanting a second diffusing species into the receiver substrate different from the first species.

16. The method according to claim 15, comprising:
determining a dose of the second diffusing species implanted in the receiver substrate based upon a depth of the cavity, a diameter of the cavity, material properties of the layer, and a dose of the first diffusing species implanted into the donor substrate.

17. The method according to claim 15, comprising:
implanting hydrogen into the donor substrate, and
implanting helium into the receiver substrate.

18. The method according to claim 17, comprising:
determining a dose of helium $D_{tot_2}$ based upon:

$$D_{tot_2} = \frac{16a}{L^2} * \sqrt{\frac{Ee^3}{(1-v^2)} * \frac{1}{k_B T} * \alpha D_{tot_1}}$$

where:
a is a depth of the cavity,
L is a diameter of the cavity,
E is a Young's modulus of a material of the layer,
e is a thickness of the layer,
v is a Poisson's ratio of the material of the layer,
$k_B$ is Boltzmann's constant
T is a temperature at which the separating is conducted,
$D_{tot_1}$ is a dose of implanted hydrogen, and
α is a fraction of the dose of implanted hydrogen found in a blister formed in the donor substrate during the separating.

19. The method according to claim 13, comprising transferring a semiconductor layer.

20. The method according to claim 13, comprising:
implanting a first diffusing species into the donor substrate to form the embrittlement plane; and
implanting a second diffusing species into the receiver substrate.

* * * * *